United States Patent
Chong (10) Patent No.: US 10,530,376 B2
(45) Date of Patent: Jan. 7, 2020

(54) PHASE INTERPOLATION AND ROTATION APPARATUS AND METHOD

(71) Applicant: Huawei Technologies Co., Ltd., Shenzhen (CN)

(72) Inventor: Euhan Chong, Ottawa (CA)

(73) Assignee: Futurewei Technologies, Inc., Plano, TX (US)

( * ) Notice: Subject to any disclaimer, the term of this patent is extended or adjusted under 35 U.S.C. 154(b) by 301 days.

(21) Appl. No.: 14/145,701

(22) Filed: Dec. 31, 2013

(65) Prior Publication Data

US 2015/0188554 A1 Jul. 2, 2015

(51) Int. Cl.
*H03L 7/24* (2006.01)
*H03K 3/03* (2006.01)
*H03K 3/0231* (2006.01)

(52) U.S. Cl.
CPC ..................... *H03L 7/24* (2013.01)

(58) Field of Classification Search
CPC ...... H03K 3/0315; H03K 3/0322; H03L 7/00; H03L 7/099; H03L 7/0995
USPC .................. 327/156, 158; 331/52, 57, 177 R
See application file for complete search history.

(56) References Cited

U.S. PATENT DOCUMENTS

| | | | |
|---|---|---|---|
| 6,442,111 B1 * | 8/2002 | Takahashi et al. | 369/44.28 |
| 2004/0046596 A1 | 3/2004 | Kaeriyama et al. | |
| 2008/0231379 A1 | 9/2008 | Jang et al. | |
| 2012/0099671 A1 * | 4/2012 | Wang | 375/295 |
| 2012/0154059 A1 | 6/2012 | van der Wel et al. | |
| 2013/0002318 A1 | 1/2013 | Lu et al. | |
| 2014/0049328 A1 * | 2/2014 | Smith et al. | 331/57 |

FOREIGN PATENT DOCUMENTS

| | | |
|---|---|---|
| CN | 102594337 A | 7/2012 |
| CN | 203206214 U | 9/2013 |
| JP | 2004104522 A | 4/2004 |

OTHER PUBLICATIONS

O'Mahony, F., et al., "A Programmable Phase Rotator based on Time-Modulated Injection-Locking," Symposium on VLSI Circuits, Technical Digest of Technical Papers, Jun. 16-18, 2010, pp. 45-46.

Luginsland, J.W., et al., "A Model of Injection-Locked Relativistic Klystron Oscillator," IEEE Transactions on Plasma Science, vol. 24, No. 3, Jun. 30, 1996, 3 pages.

International Search Report of Patent Cooperation Treaty (PCT), International Application No. PCT/CN2014/095135, Applicant Huawei Technologies Co., Ltd.., dated Mar. 27, 2015, 13 pages.

\* cited by examiner

*Primary Examiner* — Lincoln D Donovan
*Assistant Examiner* — Diana J. Cheng
(74) *Attorney, Agent, or Firm* — Slater Matsil, LLP (57) ABSTRACT

An apparatus comprises a ring oscillator comprising a plurality of delay stages connected in cascade and an injection apparatus comprising a plurality of injection devices, wherein the injection devices receive a reference clock from their inputs and outputs of the injection devices are coupled to respective outputs of the delay stages, and wherein each injection device comprises a polarity selection stage having inputs coupled to the reference clock and an adjustable gain stage having inputs coupled to outputs of the polarity selection stage and outputs coupled to outputs of a corresponding delay stage.

20 Claims, 8 Drawing Sheets

| DEGREES | PI CODE | G0 | G1 | G2 | G3 | G0_pol | G1_pol | G2_pol | G3_pol |
|---|---|---|---|---|---|---|---|---|---|
| 0 | 0 | 16 | 0 | 0 | 0 | 0 | 0 | 1 | 1 |
| 2.8125 | 1 | 15 | 1 | 0 | 0 | 0 | 0 | 1 | 1 |
| 5.625 | 2 | 14 | 2 | 0 | 0 | 0 | 0 | 1 | 1 |
| 8.4375 | 3 | 13 | 3 | 0 | 0 | 0 | 0 | 1 | 1 |
| 11.25 | 4 | 12 | 4 | 0 | 0 | 0 | 0 | 1 | 1 |
| 14.0625 | 5 | 11 | 5 | 0 | 0 | 0 | 0 | 1 | 1 |
| 16.875 | 6 | 10 | 6 | 0 | 0 | 0 | 0 | 1 | 1 |
| 19.6875 | 7 | 9 | 7 | 0 | 0 | 0 | 0 | 1 | 1 |
| 22.5 | 8 | 8 | 8 | 0 | 0 | 0 | 0 | 1 | 1 |
| 25.3125 | 9 | 7 | 9 | 0 | 0 | 0 | 0 | 1 | 1 |
| 28.125 | 10 | 6 | 10 | 0 | 0 | 0 | 0 | 1 | 1 |
| 30.9375 | 11 | 5 | 11 | 0 | 0 | 0 | 0 | 1 | 1 |
| 33.75 | 12 | 4 | 12 | 0 | 0 | 0 | 0 | 1 | 1 |
| 36.5625 | 13 | 3 | 13 | 0 | 0 | 0 | 0 | 1 | 1 |
| 39.375 | 14 | 2 | 14 | 0 | 0 | 0 | 0 | 1 | 1 |
| 42.1875 | 15 | 1 | 15 | 0 | 0 | 0 | 0 | 1 | 1 |
| 45 | 16 | 0 | 16 | 0 | 0 | 0 | 0 | 0 | 1 |
| 47.8125 | 17 | 0 | 15 | 1 | 0 | 0 | 0 | 0 | 1 |
| 50.625 | 18 | 0 | 14 | 2 | 0 | 0 | 0 | 0 | 1 |
| 53.4375 | 19 | 0 | 13 | 3 | 0 | 0 | 0 | 0 | 1 |
| 56.25 | 20 | 0 | 12 | 4 | 0 | 0 | 0 | 0 | 1 |
| 59.0625 | 21 | 0 | 11 | 5 | 0 | 0 | 0 | 0 | 1 |
| 61.875 | 22 | 0 | 10 | 6 | 0 | 0 | 0 | 0 | 1 |
| 64.6875 | 23 | 0 | 9 | 7 | 0 | 0 | 0 | 0 | 1 |
| 67.5 | 24 | 0 | 8 | 8 | 0 | 0 | 0 | 0 | 1 |
| 70.3125 | 25 | 0 | 7 | 9 | 0 | 0 | 0 | 0 | 1 |
| 73.125 | 26 | 0 | 6 | 10 | 0 | 0 | 0 | 0 | 1 |
| 75.9375 | 27 | 0 | 5 | 11 | 0 | 0 | 0 | 0 | 1 |
| 78.75 | 28 | 0 | 4 | 12 | 0 | 0 | 0 | 0 | 1 |
| 81.5625 | 29 | 0 | 3 | 13 | 0 | 0 | 0 | 0 | 1 |
| 84.375 | 30 | 0 | 2 | 14 | 0 | 0 | 0 | 0 | 1 |
| 87.1875 | 31 | 0 | 1 | 15 | 0 | 0 | 0 | 0 | 1 |

| DEGREES | PI CODE | G0 | G1 | G2 | G3 | G0_pol | G1_pol | G2_pol | G3_pol |
|---|---|---|---|---|---|---|---|---|---|
| 90 | 32 | 0 | 0 | 16 | 0 | 0 | 0 | 0 | 0 |
| 92.8125 | 33 | 0 | 0 | 15 | 1 | 1 | 0 | 0 | 0 |
| 95.625 | 34 | 0 | 0 | 14 | 2 | 1 | 0 | 0 | 0 |
| 98.4375 | 35 | 0 | 0 | 13 | 3 | 1 | 0 | 0 | 0 |
| 101.25 | 36 | 0 | 0 | 12 | 4 | 1 | 0 | 0 | 0 |
| 104.063 | 37 | 0 | 0 | 11 | 5 | 1 | 0 | 0 | 0 |
| 106.875 | 38 | 0 | 0 | 10 | 6 | 1 | 0 | 0 | 0 |
| 109.688 | 39 | 0 | 0 | 9 | 7 | 1 | 0 | 0 | 0 |
| 112.5 | 40 | 0 | 0 | 8 | 8 | 1 | 0 | 0 | 0 |
| 115.313 | 41 | 0 | 0 | 7 | 9 | 1 | 0 | 0 | 0 |
| 118.125 | 42 | 0 | 0 | 6 | 10 | 1 | 0 | 0 | 0 |
| 120.938 | 43 | 0 | 0 | 5 | 11 | 1 | 0 | 0 | 0 |
| 123.75 | 44 | 0 | 0 | 4 | 12 | 1 | 0 | 0 | 0 |
| 126.563 | 45 | 0 | 0 | 3 | 13 | 1 | 0 | 0 | 0 |
| 129.375 | 46 | 0 | 0 | 2 | 14 | 1 | 0 | 0 | 0 |
| 132.188 | 47 | 0 | 0 | 1 | 15 | 1 | 0 | 0 | 0 |
| 135 | 48 | 0 | 0 | 0 | 16 | 1 | 0 | 0 | 0 |
| 137.813 | 49 | 1 | 0 | 0 | 15 | 1 | 1 | 0 | 0 |
| 140.625 | 50 | 2 | 0 | 0 | 14 | 1 | 1 | 0 | 0 |
| 143.438 | 51 | 3 | 0 | 0 | 13 | 1 | 1 | 0 | 0 |
| 146.25 | 52 | 4 | 0 | 0 | 12 | 1 | 1 | 0 | 0 |
| 149.063 | 53 | 5 | 0 | 0 | 11 | 1 | 1 | 0 | 0 |
| 151.875 | 54 | 6 | 0 | 0 | 10 | 1 | 1 | 0 | 0 |
| 154.688 | 55 | 7 | 0 | 0 | 9 | 1 | 1 | 0 | 0 |
| 157.5 | 56 | 8 | 0 | 0 | 8 | 1 | 1 | 0 | 0 |
| 160.313 | 57 | 9 | 0 | 0 | 7 | 1 | 1 | 0 | 0 |
| 163.125 | 58 | 10 | 0 | 0 | 6 | 1 | 1 | 0 | 0 |
| 165.938 | 59 | 11 | 0 | 0 | 5 | 1 | 1 | 0 | 0 |
| 168.75 | 60 | 12 | 0 | 0 | 4 | 1 | 1 | 0 | 0 |
| 171.563 | 61 | 13 | 0 | 0 | 3 | 1 | 1 | 0 | 0 |
| 174.375 | 62 | 14 | 0 | 0 | 2 | 1 | 1 | 0 | 0 |
| 177.188 | 63 | 15 | 0 | 0 | 1 | 1 | 1 | 0 | 0 |

| DEGREES | PI CODE | G0 | G1 | G2 | G3 | G0_pol | G1_pol | G2_pol | G3_pol |
|---|---|---|---|---|---|---|---|---|---|
| 180 | 64 | 16 | 0 | 0 | 0 | 1 | 1 | 0 | 0 |
| 182.813 | 65 | 15 | 1 | 0 | 0 | 1 | 1 | 1 | 0 |
| 185.625 | 66 | 14 | 2 | 0 | 0 | 1 | 1 | 1 | 0 |
| 188.438 | 67 | 13 | 3 | 0 | 0 | 1 | 1 | 1 | 0 |
| 191.25 | 68 | 12 | 4 | 0 | 0 | 1 | 1 | 1 | 0 |
| 194.063 | 69 | 11 | 5 | 0 | 0 | 1 | 1 | 1 | 0 |
| 196.875 | 70 | 10 | 6 | 0 | 0 | 1 | 1 | 1 | 0 |
| 199.688 | 71 | 9 | 7 | 0 | 0 | 1 | 1 | 1 | 0 |
| 202.5 | 72 | 8 | 8 | 0 | 0 | 1 | 1 | 1 | 0 |
| 205.313 | 73 | 7 | 9 | 0 | 0 | 1 | 1 | 1 | 0 |
| 208.125 | 74 | 6 | 10 | 0 | 0 | 1 | 1 | 1 | 0 |
| 210.938 | 75 | 5 | 11 | 0 | 0 | 1 | 1 | 1 | 0 |
| 213.75 | 76 | 4 | 12 | 0 | 0 | 1 | 1 | 1 | 0 |
| 216.563 | 77 | 3 | 13 | 0 | 0 | 1 | 1 | 1 | 0 |
| 219.375 | 78 | 2 | 14 | 0 | 0 | 1 | 1 | 1 | 0 |
| 222.188 | 79 | 1 | 15 | 0 | 0 | 1 | 1 | 1 | 0 |
| 225 | 80 | 0 | 16 | 0 | 0 | 1 | 1 | 1 | 1 |
| 227.813 | 81 | 0 | 15 | 1 | 0 | 1 | 1 | 1 | 1 |
| 230.625 | 82 | 0 | 14 | 2 | 0 | 1 | 1 | 1 | 1 |
| 233.438 | 83 | 0 | 13 | 3 | 0 | 1 | 1 | 1 | 1 |
| 236.25 | 84 | 0 | 12 | 4 | 0 | 1 | 1 | 1 | 1 |
| 239.063 | 85 | 0 | 11 | 5 | 0 | 1 | 1 | 1 | 1 |
| 241.875 | 86 | 0 | 10 | 6 | 0 | 1 | 1 | 1 | 1 |
| 244.688 | 87 | 0 | 9 | 7 | 0 | 1 | 1 | 1 | 1 |
| 247.5 | 88 | 0 | 8 | 8 | 0 | 1 | 1 | 1 | 1 |
| 250.313 | 89 | 0 | 7 | 9 | 0 | 1 | 1 | 1 | 1 |
| 253.125 | 90 | 0 | 6 | 10 | 0 | 1 | 1 | 1 | 1 |
| 255.938 | 91 | 0 | 5 | 11 | 0 | 1 | 1 | 1 | 1 |
| 258.75 | 92 | 0 | 4 | 12 | 0 | 1 | 1 | 1 | 1 |
| 261.563 | 93 | 0 | 3 | 13 | 0 | 1 | 1 | 1 | 1 |
| 264.375 | 94 | 0 | 2 | 14 | 0 | 1 | 1 | 1 | 1 |
| 267.188 | 95 | 0 | 1 | 15 | 0 | 1 | 1 | 1 | 1 |

FIG. 4C

| DEGREES | PI CODE | G0 | G1 | G2 | G3 | G0_pol | G1_pol | G2_pol | G3_pol |
|---|---|---|---|---|---|---|---|---|---|
| 270 | 96 | 0 | 0 | 16 | 0 | 0 | 1 | 1 | 1 |
| 272.813 | 97 | 0 | 0 | 15 | 1 | 0 | 1 | 1 | 1 |
| 275.625 | 98 | 0 | 0 | 14 | 2 | 0 | 1 | 1 | 1 |
| 278.438 | 99 | 0 | 0 | 13 | 3 | 0 | 1 | 1 | 1 |
| 281.25 | 100 | 0 | 0 | 12 | 4 | 0 | 1 | 1 | 1 |
| 284.063 | 101 | 0 | 0 | 11 | 5 | 0 | 1 | 1 | 1 |
| 286.875 | 102 | 0 | 0 | 10 | 6 | 0 | 1 | 1 | 1 |
| 289.688 | 103 | 0 | 0 | 9 | 7 | 0 | 1 | 1 | 1 |
| 292.5 | 104 | 0 | 0 | 8 | 8 | 0 | 1 | 1 | 1 |
| 295.313 | 105 | 0 | 0 | 7 | 9 | 0 | 1 | 1 | 1 |
| 298.125 | 106 | 0 | 0 | 6 | 10 | 0 | 1 | 1 | 1 |
| 300.938 | 107 | 0 | 0 | 5 | 11 | 0 | 1 | 1 | 1 |
| 303.75 | 108 | 0 | 0 | 4 | 12 | 0 | 1 | 1 | 1 |
| 306.563 | 109 | 0 | 0 | 3 | 13 | 0 | 1 | 1 | 1 |
| 309.375 | 110 | 0 | 0 | 2 | 14 | 0 | 1 | 1 | 1 |
| 312.188 | 111 | 0 | 0 | 1 | 15 | 0 | 1 | 1 | 1 |
| 315 | 112 | 0 | 0 | 0 | 16 | 0 | 1 | 1 | 1 |
| 317.813 | 113 | 1 | 0 | 0 | 15 | 0 | 0 | 1 | 1 |
| 320.625 | 114 | 2 | 0 | 0 | 14 | 0 | 0 | 1 | 1 |
| 323.438 | 115 | 3 | 0 | 0 | 13 | 0 | 0 | 1 | 1 |
| 326.25 | 116 | 4 | 0 | 0 | 12 | 0 | 0 | 1 | 1 |
| 329.063 | 117 | 5 | 0 | 0 | 11 | 0 | 0 | 1 | 1 |
| 331.875 | 118 | 6 | 0 | 0 | 10 | 0 | 0 | 1 | 1 |
| 334.688 | 119 | 7 | 0 | 0 | 9 | 0 | 0 | 1 | 1 |
| 337.5 | 120 | 8 | 0 | 0 | 8 | 0 | 0 | 1 | 1 |
| 340.313 | 121 | 9 | 0 | 0 | 7 | 0 | 0 | 1 | 1 |
| 343.125 | 122 | 10 | 0 | 0 | 6 | 0 | 0 | 1 | 1 |
| 345.938 | 123 | 11 | 0 | 0 | 5 | 0 | 0 | 1 | 1 |
| 348.75 | 124 | 12 | 0 | 0 | 4 | 0 | 0 | 1 | 1 |
| 351.563 | 125 | 13 | 0 | 0 | 3 | 0 | 0 | 1 | 1 |
| 354.375 | 126 | 14 | 0 | 0 | 2 | 0 | 0 | 1 | 1 |
| 357.188 | 127 | 15 | 0 | 0 | 1 | 0 | 0 | 1 | 1 |
| 360 | 128 | 16 | 0 | 0 | 0 | 0 | 0 | 0 | 1 |

PHASE INTERPOLATION AND ROTATION APPARATUS AND METHOD

TECHNICAL FIELD

The present invention relates to an injection-locked oscillator apparatus, and more particularly, to an injection-locked oscillator apparatus capable of phase rotation and phase interpolation.

BACKGROUND

As communication technologies further advance, serial interfaces has been widely employed in communication protocols such as Ethernet, PCI Express and/or the like. As a result, serial interfaces have been widely used to convert signals between parallel bus-connected devices and high-speed serial communication systems. In order to enable the movement of a large amount of data between parallel and serial systems, a serializer/deserializer is employed to convert data from a parallel data form to a serial data form in the high-speed serial communication systems.

The serial communication system in its simplest form may comprise a transmitter, a communication channel and a receiver. The transmitter may receive a parallel set of bits and convert them into serial signals through suitable digital circuits such as multiplexers, shift registers and/or the like. The serial signals are transmitted over the communication channel to the receiver.

The receiver may comprise a clock and data recovery circuit, which is capable of extracting a clock signal from the received serial signals. The recovered clock is used to accurately sample the received data.

The receiver may further comprise an injection-locked oscillator for generating multiple clock phases from a single input phase. The multiple clock phases may be used to sample and track a variety of received data signals in the serial communication system.

SUMMARY OF THE INVENTION

These and other problems are generally solved or circumvented, and technical advantages are generally achieved, by preferred embodiments of the present invention which provide a system, apparatus and method for performing phase interpolation and rotation of an injection-locked oscillator.

In accordance with an embodiment, an apparatus comprises a ring oscillator comprising a plurality of delay stages connected in cascade and an injection apparatus comprising a plurality of injection devices, wherein the injection devices receive a reference clock from their inputs and outputs of the injection devices are coupled to respective outputs of the delay stages, and wherein each injection device comprises a polarity selection stage having inputs coupled to the reference clock and an adjustable gain stage having inputs coupled to outputs of the polarity selection stage and outputs coupled to outputs of a corresponding delay stage.

In accordance with another embodiment, a system comprises a ring oscillator comprising a first delay buffer, a second delay buffer, a third delay buffer and a fourth delay buffer connected in cascade, wherein the first delay buffer, the second delay buffer, the third delay buffer and the fourth delay buffer are differential buffers.

The system further comprises a first injection apparatus comprising a first polarity buffer and a first gain buffer connected in cascade, wherein inputs of the first injection apparatus are coupled to a reference clock and outputs of the first injection apparatus are connected to outputs of the first delay buffer, a second injection apparatus comprising a second polarity buffer and a second gain buffer connected in cascade, wherein inputs of the second injection apparatus are coupled to the reference clock and outputs of the second injection apparatus are connected to outputs of the second delay buffer, a third injection apparatus comprising a third polarity buffer and a third gain buffer connected in cascade, wherein inputs of the third injection apparatus are coupled to the reference clock and outputs of the third injection apparatus are connected to outputs of the third delay buffer and a fourth injection apparatus comprising a fourth polarity buffer and a fourth gain buffer connected in cascade, wherein inputs of the fourth injection apparatus are coupled to the reference clock and outputs of the fourth injection apparatus are connected to outputs of the fourth delay buffer.

In accordance with yet another embodiment, a method comprises receiving a reference clock from inputs of an injection apparatus, injecting a first signal into a ring oscillator at outputs of a first delay buffer of the ring oscillator, wherein the first signal is generated from the reference clock after the reference clock flows through a first polarity stage and a first gain stage, injecting a second signal into the ring oscillator at outputs of a second delay buffer of the ring oscillator, wherein the second signal is generated from the reference clock after the reference clock flows through a second polarity stage and a second gain stage, injecting a third signal into the ring oscillator at outputs of a third delay buffer of the ring oscillator, wherein the third signal is generated from the reference clock after the reference clock flows through a third polarity stage and a third gain stage and injecting a fourth signal into the ring oscillator at outputs of a fourth delay buffer of the ring oscillator, wherein the fourth signal is generated from the reference clock after the reference clock flows through a fourth polarity stage and a fourth gain stage.

An advantage of a preferred embodiment of the present invention is having an injection-locked oscillator capable of performing both phase interpolation and phase rotation. As a result, the injection-locked oscillator may help to improve a variety of performance characteristics such as reduced integrated circuit die area, low power consumption, reduced jitter and glitches, simplified and shortened clock distribution paths and/or the like.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an injection-locked oscillator. The invention may also be applied, however, to calibrating a variety of oscillators. Hereinafter, various embodiments will be explained in detail with reference to the accompanying drawings.

Figure 1:
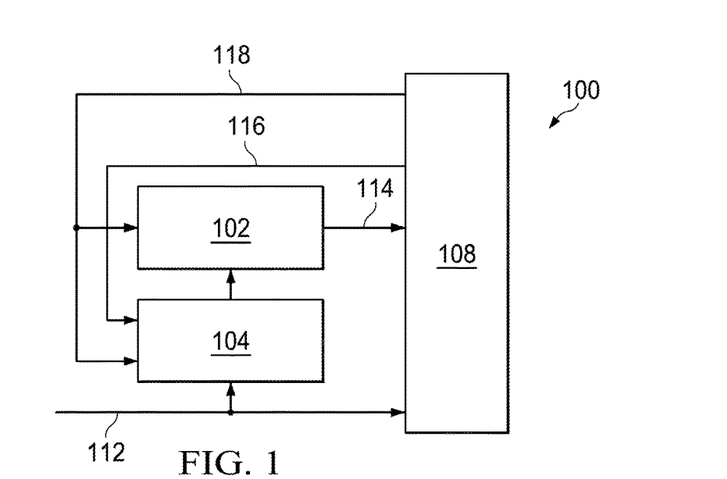
FIG. 1 illustrates a block diagram of an injection-locked oscillator in accordance with various embodiments of the present disclosure.

FIG. 1 illustrates a block diagram of an injection-locked oscillator in accordance with various embodiments of the present disclosure. The injection-locked oscillator 100 includes a ring oscillator 102, an injection apparatus 104 and a calibration apparatus 108. As shown in FIG. 1, a reference clock 112 may be fed into the injection apparatus 104 as well as the calibration apparatus 108.

The output of the injection apparatus 104 is coupled to the ring oscillator 102. In particular, the reference clock 112 may be injected into the ring oscillator 102 at multiple injection points through the injection apparatus 104. In other words, the injection apparatus 104 may function as a buffer coupled between the reference clock 112 and the ring oscillator 102. The detailed schematic of the injection apparatus 104 will be described below with respect to FIG. 2A and FIG. 2B.

The ring oscillator 102 receives injected signals from the injection apparatus 104. Meanwhile, the ring oscillator 102 generates a clock 114. The clock 114 may function as a clock signal for a clock/data recovery circuit (CDR) to sample and track a variety of received data signals (not shown).

In some embodiments, the frequency and/or the center frequency of the clock 114 may match the frequency of the injected signal (e.g., reference clock 112) from the injection apparatus 104. A mismatch between the frequency of the clock 114 and the injected signal such as the reference clock 112 may cause degraded performance characteristics such as phase mismatch, reduced tracking bandwidth, reduced locking range, increased jitter, any combinations thereof and/or the like.

The calibration apparatus 108 receives the reference clock 112 and the clock 114. Based upon a calibration algorithm, the calibration apparatus 108 generates a first calibration signal 116 and a second calibration signal 118. As shown in FIG. 1, the first calibration signal 116 is fed into the injection apparatus 104. The second calibration signal 118 is fed into the ring oscillator 102 and the injection apparatus 104.

In some embodiments, the first calibration signal 116 is employed to coarsely tune some tunable parameters such as the gains of the buffers of the injection apparatus 104. Throughout the description, the first calibration signal 116 is alternatively referred to as a coarse-tuning code 116.

Figure 2A:
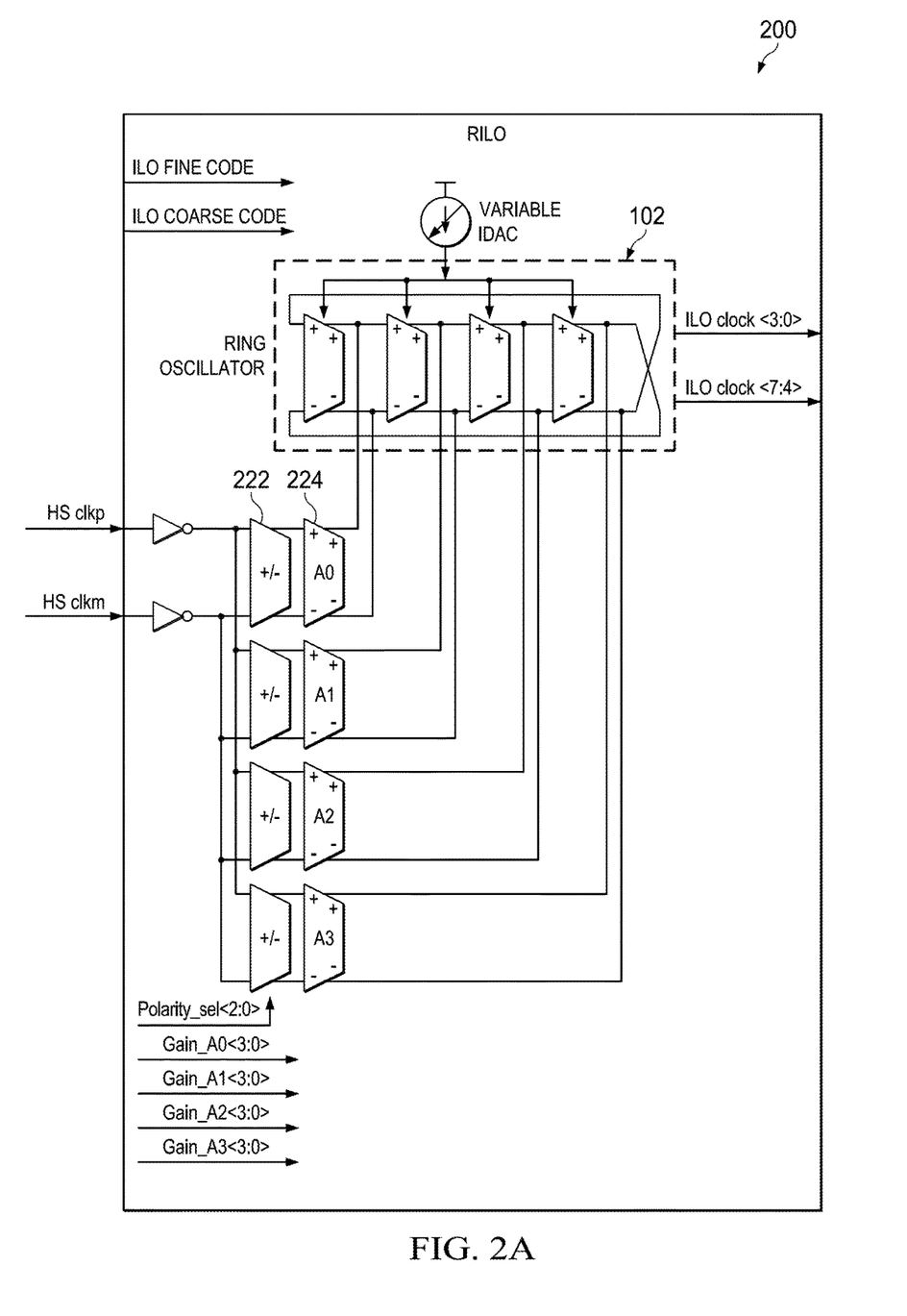
FIG. 2A illustrates a schematic diagram of the injection-locked oscillator shown in FIG. 1 in accordance with various embodiments of the present disclosure.

The second calibration signal 118 is employed to fine-tune some tunable parameters such as the bias currents of the buffers of the injection apparatus and delay cells (not shown but illustrated in FIG. 2) of the ring oscillator 102. Throughout the description, the second calibration signal 118 is alternatively referred to as a fine-tuning code 118.

In sum, by employing the coarse-tuning code 116 and the fine-tuning code 118, the output signal of the ring oscillator 102 may closely match the injected signal of the ring oscillator 102. Furthermore, different operation conditions such as a different environmental temperature or a different operating voltage may not cause an offset or error of the frequency of the output signal because the calibration apparatus 108 helps to correct the offset/error through the coarse-tuning code 116, the fine-tuning code 118 and any combinations thereof.

FIG. 2A illustrates a schematic diagram of the injection-locked oscillator shown in FIG. 1 in accordance with various embodiments of the present disclosure. The injection-locked oscillator 200 comprises ring oscillator 102, a plurality of polarity buffers (e.g., polarity buffer 222) and a plurality of gain buffers (e.g., gain buffer 224). As shown in FIG. 2A, the polarity buffers are controlled by Polarity_sel<2:0>. The gain buffers are controlled by Gain_A0<3:0>, Gain_A1<3:0>, Gain_A2<3:0> and Gain_A3<3:0> respectively. Polarity_sel<2:0>, Gain_A0<3:0>, Gain_A1<3:0>, Gain_A2<3:0> and Gain_A3<3:0> may form a phase code control mechanism, through which phase rotation of the injection-locked oscillator 200 may be achieved. The detailed process of achieving phase rotation will be described below with respect to FIGS. 4A-4D.

In order to keep the output frequency of the ring oscillator 102 is the same as the input frequency (e.g., HS clkp and HS clkm as shown in FIG. 2A), the injection-locked oscillator 200 receives the coarse-tuning code 116 and the fine-tuning code 118. In particular, the coarse-tuning code 116 and the fine-tuning code 118 may help the output signal of the ring oscillator 102 closely match the injected signal of the ring oscillator 102.

Figure 2B:
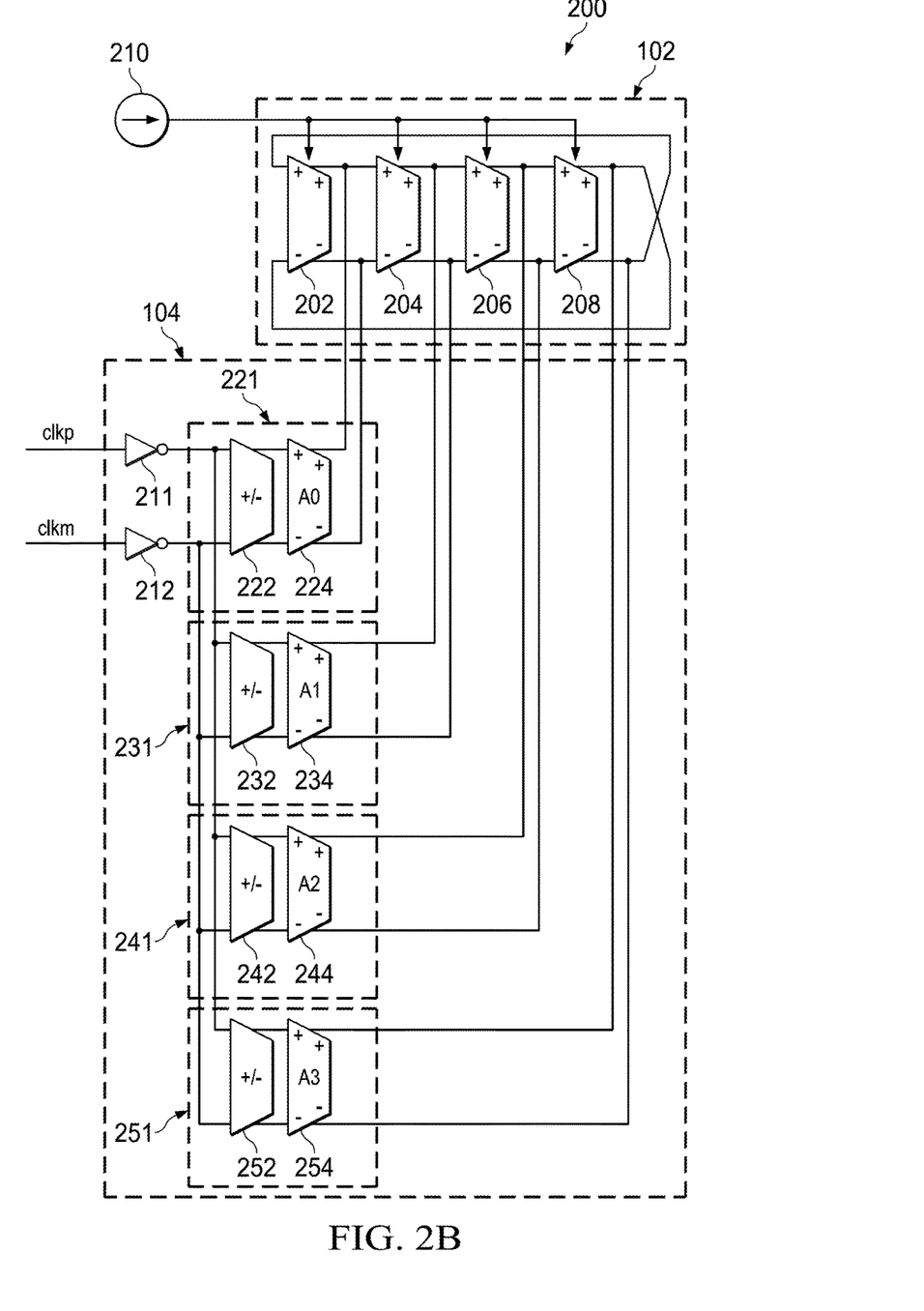
FIG. 2B illustrates in detail the schematic diagram of the injection-locked oscillator shown in FIG. 1 in accordance with various embodiments of the present disclosure.

FIG. 2B illustrates in detail the schematic diagram of the injection-locked oscillator shown in FIG. 1 in accordance with various embodiments of the present disclosure. The injection-locked oscillator 200 may comprise the ring oscillator 102 and the injection apparatus 104. In some embodiments, the ring oscillator 102 may comprise four delay cells 202, 204, 206 and 208. In some embodiments, the delay cells 202, 204, 206 and 208 are implemented as differential buffers as shown in FIG. 2B. Throughout the description, the delay cells may be alternatively referred to as differential buffers.

As shown in FIG. 2B, the differential buffers 202, 204, 206 and 208 are connected in cascade to form a ring oscillator. An injected signal is fed into the output of each differential buffer (e.g., first differential buffer 202). The outputs of the fourth differential buffer 208 are the clock 114.

As shown in FIG. 2B, the outputs of the fourth differential buffer 208 are fed into the inputs of the first differential buffer 202 to form the ring oscillator 102. In particular, a positive output of the fourth differential buffer 208 is connected to a negative input of the first differential buffer 202. Likewise, a negative output of the fourth differential buffer 208 is connected to a positive input of the first differential buffer 202. The operation principle of a ring oscillator is well known in the art, and hence is not discussed in further detail herein to avoid unnecessary repetition.

It should be noted that the schematic diagram of the ring oscillator is merely an example, which should not unduly limit the scope of the claims. One of ordinary skill in the art would recognize many variations, alternatives, and modifications. For example, the ring oscillator may have different configurations such as including differing numbers of delay elements (e.g., six differential buffers connected in cascade).

The injection apparatus 104 may comprise four injection devices 221, 231, 241 and 251. In some embodiments, each injection device (e.g., first injection device 221) may comprise a polarity buffer and a gain buffer connected in cascade. As shown in FIG. 2B, the first injection device 221 may comprise a first polarity buffer 222 and a first gain buffer 224. Likewise, the second injection device 231 comprises a second polarity buffer 232 and a second gain buffer 234. The third injection device 241 comprises a third polarity buffer 242 and a third gain buffer 244. The fourth injection device 251 comprises a fourth polarity buffer 252 and a fourth gain buffer 254.

In some embodiments, the polarity buffers (e.g., the first polarity buffer 222) may be implemented as a multiplexer with polarity control. The operation principle of multiplexers is well known, and hence is not discussed herein.

The gain buffers (e.g., the first gain buffer 224) may be implemented as a plurality of controllable buffers connected in parallel. The detailed schematic diagram of the gain buffers will be described in detail below with respect to FIG. 3.

As shown in FIG. 2B, a positive input of the first injection device 221 is coupled to a positive clock signal clkp through a first buffer 211. A negative input of the first injection device 221 is coupled to a negative clock signal clkm through a second buffer 212. A positive output of the first injection device 221 is connected to a positive output of the first differential buffer 202 and a negative output of the first injection device 221 is connected to a negative output of the first differential buffer 202.

Likewise, the inputs of the second injection device 231 are coupled to clkp and clkm respectively. A positive output of the second injection device 231 is connected to a positive output of the second differential buffer 204 and a negative output of the second injection device 231 is connected to a negative output of the second differential buffer 204.

As shown in FIG. 2B, the inputs of the third injection device 241 are coupled to clkp and clkm respectively. A positive output of the third injection device 241 is connected to a positive output of the third differential buffer 206 and a negative output of the third injection device 241 is connected to a negative output of the third differential buffer 206. Likewise, the inputs of the fourth injection device 251 are coupled to clkp and clkm respectively. A positive output of the fourth injection device 251 is connected to the positive output of the fourth differential buffer 208 and a negative output of the fourth injection device 251 is connected to the negative output of the fourth differential buffer 208.

FIG. 2B further illustrates an adjustable current source 210. The adjustable current source 210 is employed to provide bias currents for the differential buffers (e.g., first differential buffer 202). The bias current of each differential buffer may be adjustable too. By adjusting the bias currents of the differential buffers, the frequency of the clock 114 may be fine-tuned accordingly.

It should be noted that, in order to achieve phase interpolation, two adjacent injection devices (e.g., the first injection device 221 and the second injection device 231) may be turned on at the same time. The strength of each injection device is digitally controlled so as to achieve phase interpolation. On the other hand, all injection devices may be independently controlled to achieve a 360 degree phase rotation.

One advantageous feature of having the phase interpolation function within the injection locked oscillator is that the phase interpolator driver and corresponding phase interpolator circuits may be saved. As a result, the power consumption as well as the layout area of the injection locked oscillator and clock generation circuitry may be reduced.

In some embodiments, by employing the embodiment shown in FIG. 2B, the power consumption of an injection locked oscillator may be reduced by 12.6 mW or 38%. Furthermore, jitter may be reduced due to a shorter clock path. Moreover, no additional noise is added due to the phase interpolation function embedded in the injection locked oscillator.

Figure 3:
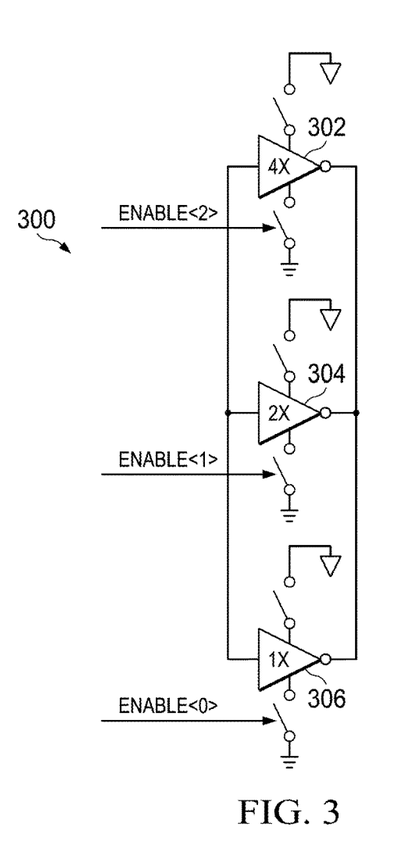
FIG. 3 illustrates a schematic diagram of a gain buffer in accordance with various embodiments of the present disclosure.

FIG. 3 illustrates a schematic diagram of a gain buffer in accordance with various embodiments of the present disclosure. The gain buffer 300 shown in FIG. 3 may comprise a plurality of buffers connected in parallel. More particularly, the gain buffer 300 comprises four digitally controlled buffers, namely a first digitally controlled buffer 302, a second digitally controlled buffer 304 and a third digitally controlled buffer 306. The digitally controlled buffers 302, 304 and 306 may form a binary weighted circuit. As shown in FIG. 3, the gains of digitally controlled buffers 302, 304 and 306 are in the ratio 4:2:1. It should be noted that the diagram shown in FIG. 3 is binary weighted for simplicity. The actual implementation may be encoded using suitable control mechanisms such as thermometer code and/or the like.

The on/off of each digitally controlled buffer shown in FIG. 3 is determined by a gain control signal. In particular, when the gain control signal is set to 1, the digitally controlled buffer is enabled. On the other hand, when the gain control signal is set to 0, the digitally controlled buffer is disabled. In some embodiments, the gain control signal may comprise four digits. Each digit corresponds to a gain control signal. An illustrative embodiment of the gain control signal will be described below with respect to FIGS. 4A-4D.

FIGS. 4A-4D illustrate an illustrative embodiment of a phase rotation table in accordance with various embodiments of the present disclosure. A full 360 degree phase rotation is divided into four portions, which are illustrated in FIGS. 4A-4D respectively. The phase rotation table 402 comprises an injection locked oscillation phase code and the first 32 steps of a full 360 degree phase rotation. The injection locked oscillation code shown in the phase rotation table 402 illustrates the phase rotation is up to 90 degrees with 7-bit resolution. G0, G1, G2 and G3 are the gain controls of the gain buffers (e.g., the first gain buffer 224 shown in FIG. 2B). Each of the gain controls comprises four bits. Such four bits may result in 16 phase steps. G0_pol, G1_pol, G2_pol and G3_pol represent the polarity of the four polarity buffers.

Each gain buffer (shown in FIG. 2B) may have four control bits to adjust its gain. There may be one additional bit for controlling the polarity of the polarity buffers (shown in FIG. 2B). Furthermore, there may be two bits for controlling G0_pol, G1_pol, G2_pol and G3_pol. As such, the injection locked oscillation phase code generates a phase rotation mechanism with seven-bit resolution.

Figure 4A:
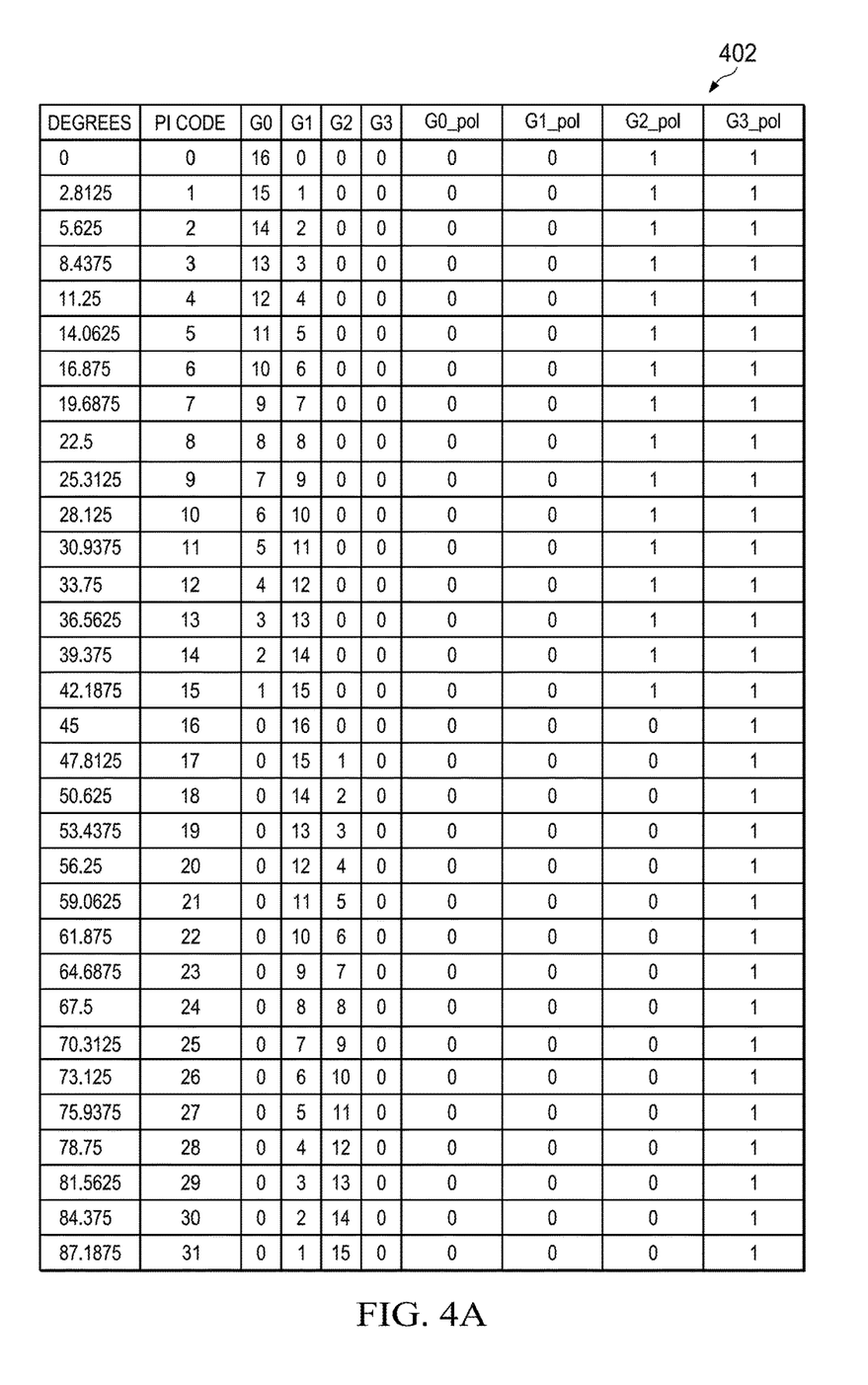
FIGS. 4A-4D illustrate an illustrative embodiment of a phase rotation table in accordance with various embodiments of the present disclosure.

As shown in FIG. 4A, the phase shift at the output of ring oscillator increases in fine increments from 0 to 90 degrees. Each incremental step is equal to 2.8125 degrees. In other words, there may be 128 phase steps for a full 360 degree rotation.

Figure 4B:
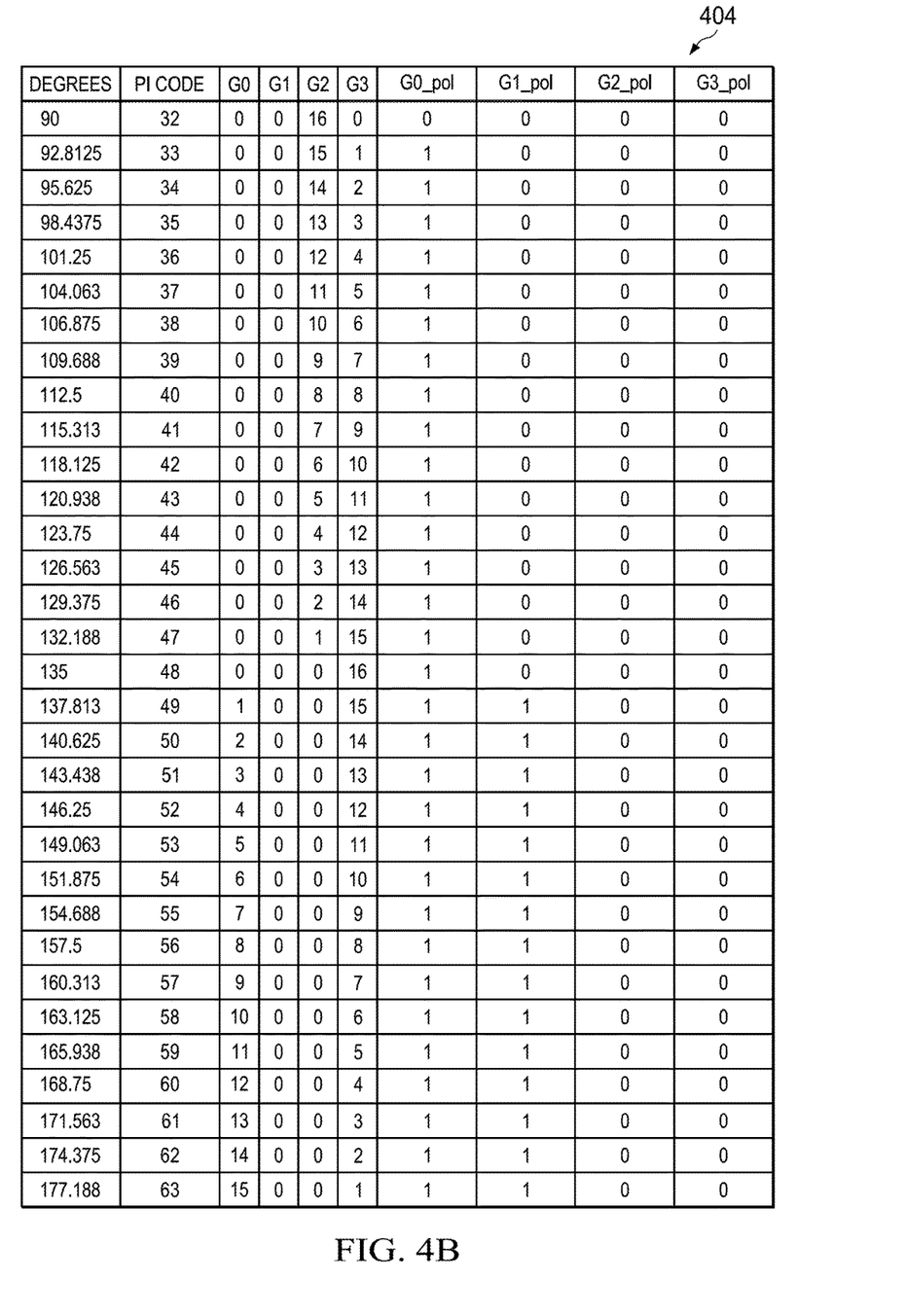

The phase rotation table 404 of FIG. 4B illustrates the second 32 steps of the full 360 degree phase rotation. As shown in FIG. 4B, the phase shift at the output of ring oscillator increases in fine increments from 90 to 180 degrees.

Figure 4C:
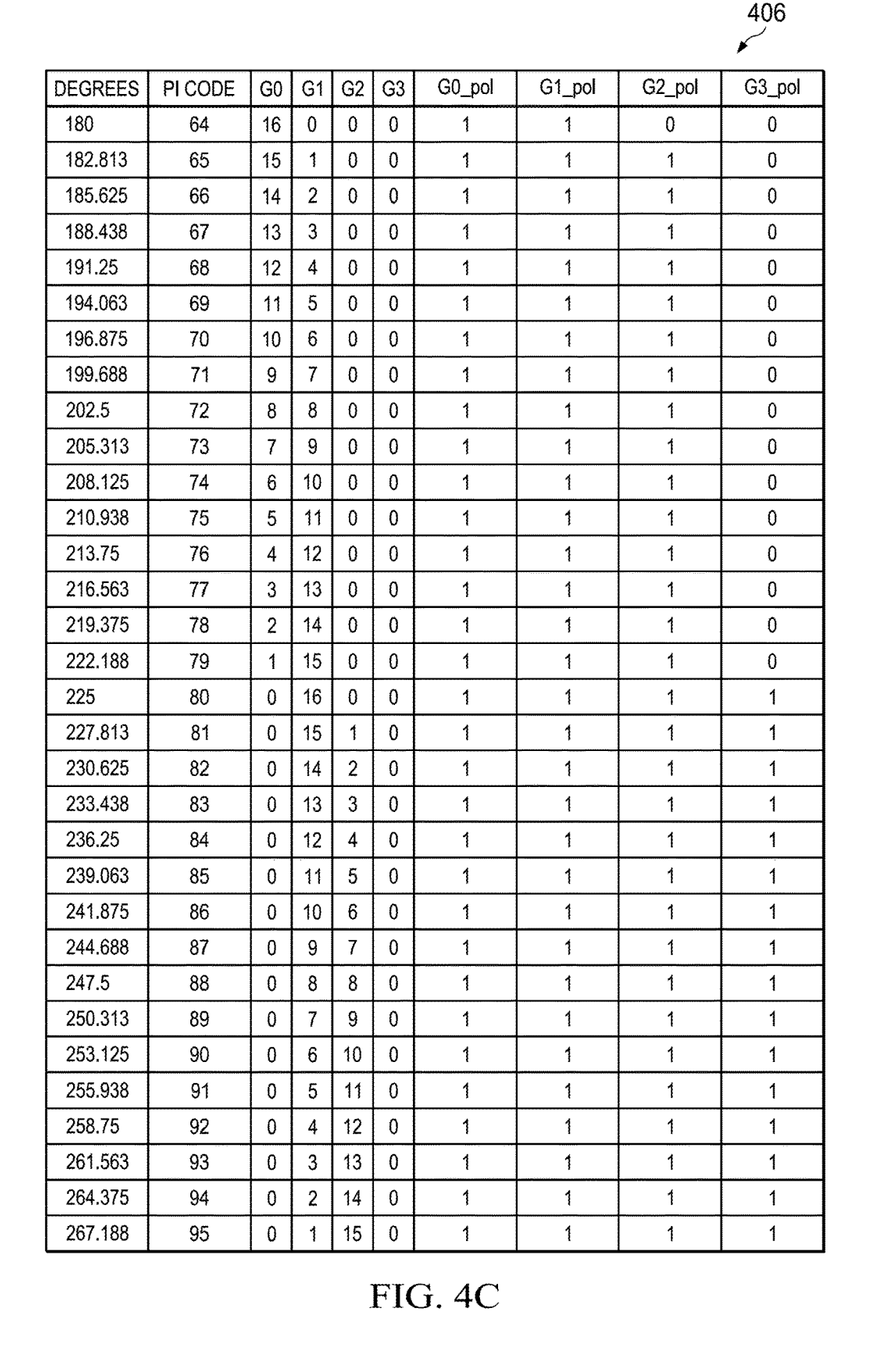

The phase rotation table 406 of FIG. 4C illustrates the third 32 steps of the full 360 degree phase rotation. As shown in FIG. 4C, the phase shift at the output of ring oscillator increases in fine increments from 180 to 270 degrees.

Figure 4D:
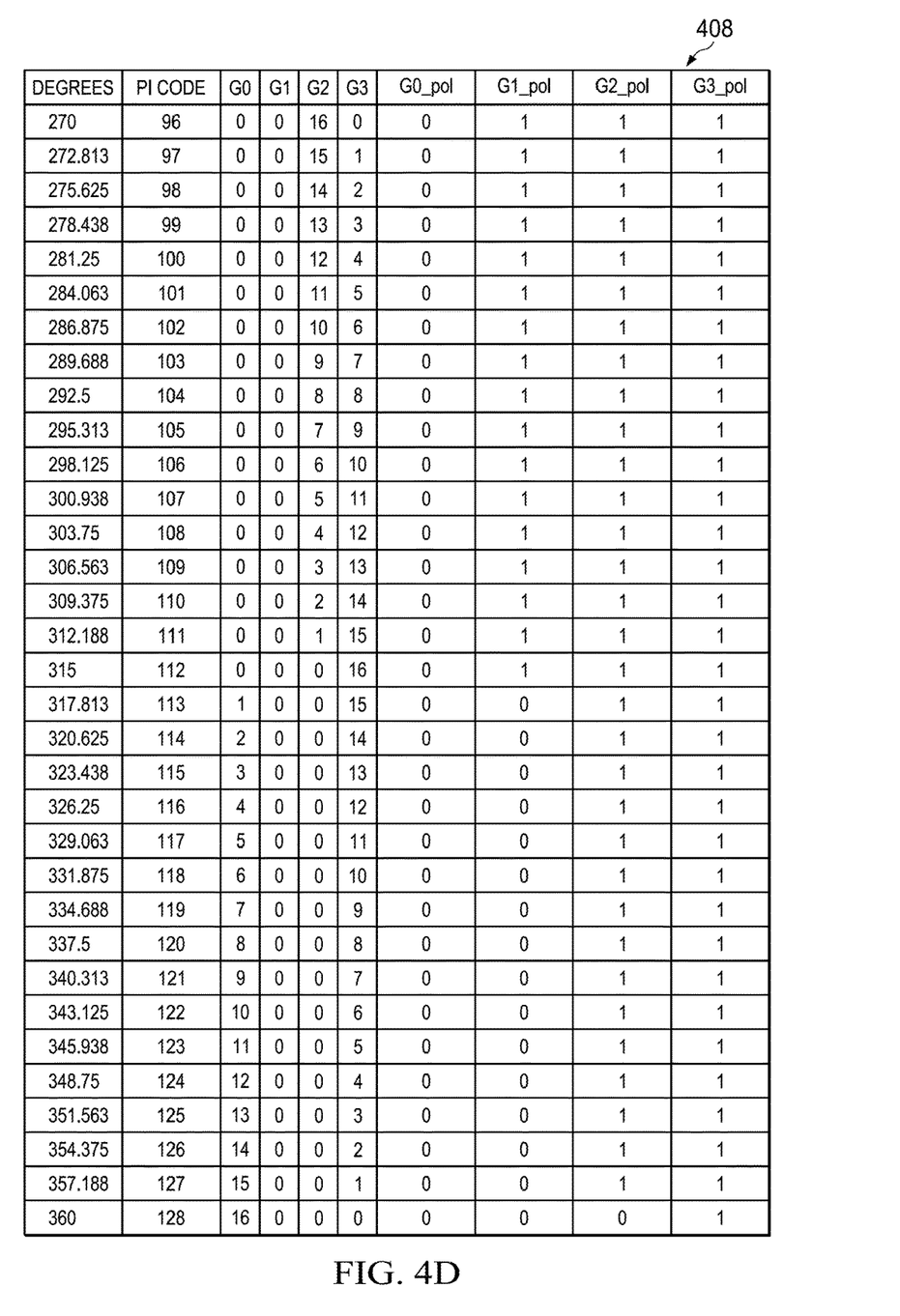

The phase rotation table 408 of FIG. 4D illustrates the fourth 32 steps of the full 360 degree phase rotation. As shown in FIG. 4D, the phase shift at the output of ring oscillator increases in fine increments from 270 to 360 degrees.

Figure 5:
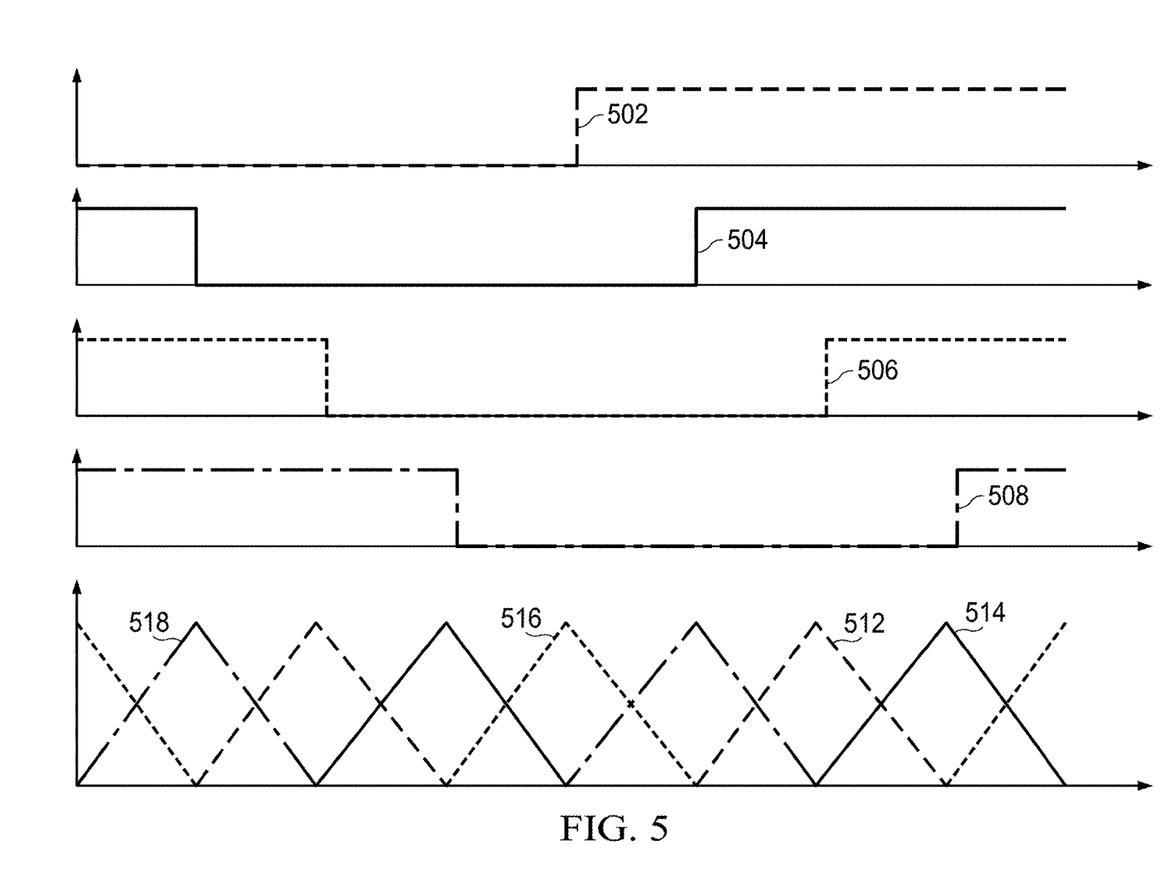
FIG. 5 illustrates a timing diagram showing signals associated with the embodiment shown in FIGS. 4A-4D.

FIG. 5 illustrates a timing diagram showing signals associated with the embodiment shown in FIGS. 4A-4D. As shown in FIG. 5, a waveform 502 represents the polarity of the first polarity buffer 222 (shown in FIG. 2B). In one period of the clock 112 (shown in FIG. 1), a logic high state of the waveform 502 indicates a positive polarity at the first polarity buffer 222. On the other hand, a logic low state of the waveform 502 indicates a negative polarity at the first polarity buffer 222. As shown in FIG. 5, the first polarity buffer 222 switches between the positive polarity and the negative polarity during one period corresponding to a period of the clock signal 112.

A waveform 504 represents the polarity of the second polarity buffer 232 (shown in FIG. 2B). The waveform 504 is similar to the waveform 502 except that there may be a phase shift between waveform 502 and waveform 504. As shown in FIG. 5, the phase shift is 45 degrees. Waveforms 506 and 508 represent the polarities of the third polarity buffer 242 and the fourth polarity buffer 252 respectively. There is a 45 degree phase shift between waveform 504 and waveform 506. Likewise, there is a 45 degree phase shift between waveform 506 and waveform 508.

As shown in FIG. 5, the duty cycle of the waveform 502 is 50%. Similarly, the duty cycles of the waveform 504, 506 and 508 are 50%. As described above, waveforms 502, 504, 506 and 508 are equally spaced during one period of the clock. The phase shift between two adjacent waveforms (e.g., waveforms 502 and 504) is equal to 45 degrees.

The waveform 512 represents the gain of the first gain buffer 224 (shown in FIG. 2B). As shown in FIG. 5, in each half period such as a logic high period of the waveform 502, the gain of the first gain buffer 224 linearly increases from zero to a peak and then linearly decreases from the peak gain to zero. The gain of the first gain buffer 224 reaches its maximum in the middle of the logic high period of the waveform 502. It should be noted the polarity change of the polarity buffer 222 only occurs when the first gain buffer 224 is in active to avoid any glitches in the phase rotation process.

As shown in FIG. 5, the gains of the second gain buffer 234, the third gain buffer 244 and the fourth gain buffer 254 are represented by the waveforms 514, 516 and 518 respectively. The gain changes of waveforms 514, 516 and 518 are similar to the gain change of the waveform 512, and hence are not discussed herein.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
a ring oscillator comprising a plurality of delay stages connected in cascade; and
an injection apparatus comprising a plurality of injection devices, wherein:
the injection devices receive a reference clock from their inputs; and
outputs of the injection devices are coupled to respective outputs of the delay stages, and wherein each injection device comprises:
a polarity selection stage having inputs coupled to the reference clock; and
an adjustable gain stage having inputs coupled to outputs of the polarity selection stage and outputs directly connected to outputs of a corresponding delay stage.

2. The apparatus of claim 1, wherein:
the ring oscillator comprises a first differential delay stage, a second differential delay stage, a third differential delay stage and a fourth differential delay stage connected in cascade, and wherein:
a positive output of the fourth differential delay stage is connected to a negative input of the first differential delay stage; and
a negative output of the fourth differential delay stage is connected to a positive input of the first differential delay stage.

3. The apparatus of claim 2, wherein:
the injection apparatus comprises a first injection device, a second injection device, a third injection device and a fourth injection device, and wherein:
a positive output of the first injection device is connected to a positive output of the first differential delay stage and a negative output of the first injection device is connected to a negative output of the first differential delay stage;

a positive output of the second injection device is connected to a positive output of the second differential delay stage and a negative output of the second injection device is connected to a negative output of the second differential delay stage;
a positive output of the third injection device is connected to a positive output of the third differential delay stage and a negative output of the third injection device is connected to a negative output of the third differential delay stage; and
a positive output of the fourth injection device is connected to the positive output of the fourth differential delay stage and a negative output of the fourth injection device is connected to the negative output of the fourth differential delay stage.

4. The apparatus of claim 3, wherein:
the first injection device comprises a first polarity selection stage and a first adjustable gain stage connected in cascade, and wherein the first polarity selection stage is of a first polarity and the first adjustable gain stage is of a first gain;
the second injection device comprises a second polarity selection stage and a second adjustable gain stage connected in cascade, and wherein the second polarity selection stage is of a second polarity and the second adjustable gain stage is of a second gain;
the third injection device comprises a third polarity selection stage and a third adjustable gain stage connected in cascade, and wherein the third polarity selection stage is of a third polarity and the third adjustable gain stage is of a third gain; and
the fourth injection device comprises a fourth polarity selection stage and a fourth adjustable gain stage connected in cascade, and wherein the fourth polarity selection stage is of a fourth polarity and the fourth adjustable gain stage is of a fourth gain.

5. The apparatus of claim 4, wherein:
an output frequency of the ring oscillator is equal to an input frequency of the ring oscillator when a phase code of the ring oscillator is in a static state.

6. The apparatus of claim 4, wherein:
phase rotation at outputs of the ring oscillator is obtained through sequentially rotating phase codes of the ring oscillator.

7. The apparatus of claim 1, further comprising:
an adjustable current source coupled to the delays stages, wherein the adjustable current source provides bias currents for the delays stages, and wherein the bias currents are adjusted such that a frequency of outputs of the ring oscillator is approximately equal to a frequency of the reference clock.

8. A system comprising:
a ring oscillator comprising a first delay buffer, a second delay buffer, a third delay buffer and a fourth delay buffer connected in cascade, wherein the first delay buffer, the second delay buffer, the third delay buffer and the fourth delay buffer are differential buffers;
a first injection apparatus comprising a first polarity buffer and a first gain buffer connected in cascade, wherein inputs of the first injection apparatus are coupled to a reference clock and outputs of the first injection apparatus are directly connected to outputs of the first delay buffer;
a second injection apparatus comprising a second polarity buffer and a second gain buffer connected in cascade, wherein inputs of the second injection apparatus are coupled to the reference clock and outputs of the second injection apparatus are directly connected to outputs of the second delay buffer;
a third injection apparatus comprising a third polarity buffer and a third gain buffer connected in cascade, wherein inputs of the third injection apparatus are coupled to the reference clock and outputs of the third injection apparatus are directly connected to outputs of the third delay buffer; and
a fourth injection apparatus comprising a fourth polarity buffer and a fourth gain buffer connected in cascade, wherein inputs of the fourth injection apparatus are coupled to the reference clock and outputs of the fourth injection apparatus are directly connected to outputs of the fourth delay buffer.

9. The system of claim 8, wherein:
a first injection apparatus and a second injection apparatus are turned on and a first gain of the first gain buffer and a second gain of the second gain buffer are controlled through phase codes applied to the ring oscillator.

10. The system of claim 9, wherein:
the first gain of the first gain buffer, the second gain of the second gain buffer, the third gain of the third gain buffer and the fourth gain of the fourth gain buffer are controlled with N-bits of resolution.

11. The system of claim 9, wherein:
the phase interpolation has (8 times 2 to the exponent N) phase steps over one period of the reference clock.

12. The system of claim 11, wherein:
a first polarity of the first polarity buffer, a second polarity of the second polarity buffer, a third polarity of the third polarity buffer and a fourth polarity of the fourth polarity buffer are configured such that:
phase rotation is obtained at outputs of the ring oscillator.

13. The system of claim 12, wherein:
the phase rotation comprises a plurality of phase shifts, and wherein the phase shift is equal to 360/N degrees.

14. A method comprising:
receiving a reference clock from inputs of an injection apparatus;
injecting a first signal into a ring oscillator at outputs of a first delay buffer of the ring oscillator, wherein the first signal is generated from the reference clock after the reference clock flows through a first polarity stage and a first gain stage, and wherein the first polarity stage and the first gain stage are connected in cascade;
injecting a second signal into the ring oscillator at outputs of a second delay buffer of the ring oscillator, wherein the second signal is generated from the reference clock after the reference clock flows through a second polarity stage and a second gain stage, and wherein the second polarity stage and the second gain stage are connected in cascade;
injecting a third signal into the ring oscillator at outputs of a third delay buffer of the ring oscillator, wherein the third signal is generated from the reference clock after the reference clock flows through a third polarity stage and a third gain stage, and wherein the third polarity stage and the third gain stage are connected in cascade; and
injecting a fourth signal into the ring oscillator at outputs of a fourth delay buffer of the ring oscillator, wherein the fourth signal is generated from the reference clock after the reference clock flows through a fourth polarity stage and a fourth gain stage, wherein the fourth polarity stage and the fourth gain stage are connected in cascade, wherein the first gain stage, the second gain stage, the third gain stage and the fourth gain stage have different gains from each other, wherein phase rotation is achieved through adjusting gains of the first gain stage, the second gain stage, the third gain stage and the fourth gain stage, and wherein the gain of each gain stage is adjusted through control bits.

15. The method of claim 14, further comprising:

adjusting gains of two adjacent gain stages so as to obtain phase interpolation of the ring oscillator.

16. The method of claim 15, further comprising:

digitally controlling the gains of the two adjacent gain stages based upon 4 digital bits.

17. The method of claim 14, wherein:

the first delay buffer, the second delay buffer, the third delay buffer and the fourth delay buffer are connected in cascade.

18. The method of claim 17, wherein:

the first delay buffer is a first differential delay stage;

the second delay buffer is a second differential delay stage;

the third delay buffer is a third differential delay stage; and the fourth delay buffer is a fourth differential delay stage, and wherein:

a positive output of the fourth differential delay stage is connected to a negative input of the first differential delay stage; and a negative output of the fourth differential delay stage is connected to a positive input of the first differential delay stage.

19. The method of claim 14, wherein:

inputs of the first polarity stage are coupled to the reference clock and outputs of the first gain stage are connected to the outputs of the first delay buffer;

inputs of the second polarity stage are coupled to the reference clock and outputs of the second gain stage are connected to the outputs of the second delay buffer;

inputs of the third polarity stage are coupled to the reference clock and outputs of the third gain stage are connected to the outputs of the third delay buffer; and inputs of the fourth polarity stage are coupled to the reference clock and outputs of the fourth gain stage are connected to the outputs of the fourth delay buffer.

20. The method of claim 14, further comprising:

adjusting an adjustable current source coupled to the first delay buffer, the second delay buffer, the third delay buffer and the fourth delay buffer such that a frequency of outputs of the ring oscillator is approximately equal to a frequency of the reference clock.

* * * * *